United States Patent
Sakai et al.

(10) Patent No.: US 11,160,172 B2
(45) Date of Patent: Oct. 26, 2021

(54) METHOD FOR PRODUCING CERAMIC CIRCUIT BOARD

(71) Applicant: DENKA COMPANY LIMITED, Tokyo (JP)

(72) Inventors: Atsushi Sakai, Omuta (JP); Yoshitaka Taniguchi, Omuta (JP); Suzuya Yamada, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 14 days.

(21) Appl. No.: 16/477,628

(22) PCT Filed: Jan. 16, 2018

(86) PCT No.: PCT/JP2018/001022
§ 371 (c)(1),
(2) Date: Jul. 12, 2019

(87) PCT Pub. No.: WO2018/135490
PCT Pub. Date: Jul. 26, 2018

(65) Prior Publication Data
US 2020/0128677 A1  Apr. 23, 2020

(30) Foreign Application Priority Data
Jan. 17, 2017 (JP) .............................. JP2017-006089

(51) Int. Cl.
*C23C 24/04* (2006.01)
*H05K 3/14* (2006.01)

(52) U.S. Cl.
CPC ............. *H05K 3/143* (2013.01); *C23C 24/04* (2013.01); *H05K 2203/0126* (2013.01); *H05K 2203/086* (2013.01)

(58) Field of Classification Search
CPC .................................................. C23C 24/04
See application file for complete search history.

(56) References Cited

U.S. PATENT DOCUMENTS

| | | | | |
|---|---|---|---|---|
| 2004/0101620 A1* | 5/2004 | Elmoursi | ............. | C04B 41/009 427/180 |
| 2006/0258055 A1* | 11/2006 | Okamoto | ............ | H01L 23/3735 438/124 |
| 2015/0376762 A1* | 12/2015 | Saito | ....................... | C23C 24/04 427/455 |
| 2018/0315680 A1* | 11/2018 | Aikawa | ................... | B05D 7/24 |

FOREIGN PATENT DOCUMENTS

| | | |
|---|---|---|
| DE | 10 2013 113 736 A1 | 6/2015 |
| EP | 2 732 967 A1 | 5/2014 |
| JP | H11-251698 A | 9/1999 |
| JP | 2009-197294 A | 9/2009 |
| JP | 2013-018190 A | 1/2013 |
| JP | 2016-152324 A | 8/2016 |
| KR | 2012-0030884 A | 3/2012 |
| WO | 2015/064430 A1 | 5/2015 |
| WO | 2016/021561 A1 | 2/2016 |

OTHER PUBLICATIONS

Machine translation of JP 2012-57203 (incorporated by reference to Document A).*
Nov. 14, 2019 Extended Search Report issued in European Patent Application No. 18741472.7.
Jul. 23, 2019 International Preliminary Report on Patentability issued in International Patent Application No. PCT/JP2018/001022.
Mar. 27, 2018 Search Report issued in International Patent Application No. PCT/JP2018/001022.

* cited by examiner

*Primary Examiner* — Austin Murata
(74) *Attorney, Agent, or Firm* — Oliff PLC

(57) ABSTRACT

A method for producing a ceramic circuit board including a ceramic substrate and a metal circuit formed on the ceramic substrate. The disclosed method includes a step of forming the first metal layer in contact with the ceramic substrate by spraying a first metal powder containing at least either of aluminum particles or aluminum alloy particles together with an inert gas onto a surface of a ceramic substrate from a nozzle, in which the first metal powder is heated to from 10° C. to 270° C. and then ejected from the nozzle 10 and a gauge pressure of the inert gas at an inlet of the nozzle 10 is from 1.5 to 5.0 MPa, a step of subjecting the first metal layer to a heat treatment in an inert gas atmosphere, and the like.

3 Claims, 3 Drawing Sheets

METHOD FOR PRODUCING CERAMIC CIRCUIT BOARD

TECHNICAL FIELD

The present invention relates to a method for producing a ceramic circuit board.

BACKGROUND ART

In recent years, power modules such as inverters which work at a great current and exhibit high efficiency have been developed in association with the advancement of performance of industrial devices such as robots and motors. For this reason, the amount of heat generated from semiconductor devices has continuously increased. In order to efficiently diffuse the heat generated, ceramic circuit boards and the like exhibiting favorable thermal conductivity are used.

Modules having ceramic circuit boards have initially been used in simple machine tools but have recently been used in applications, such as welding machines, drive units of electric trains, and electric vehicles, which are required to exhibit durability under more severe environmental conditions and to be further miniaturized. For this reason, the ceramic circuit boards are also required to have an increased thickness of the metal circuit for increasing the current density and to exhibit improved durability with respect to thermal shock.

As a material for the metal circuit portion of ceramic circuit boards, copper is mainly used since a high voltage of several thousand volts and a high current of several hundred amperes flow. However, ceramic circuit boards are repeatedly exposed to thermal shock by environmental changes at the time of use, heat generated by switching, and the like, and there is thus a case in which the copper circuit layer peels off from the ceramic substrate due to the thermal stress due to the difference in thermal expansion between copper and the ceramic.

In order to improve thermal shock resistance, ceramic circuit boards having an aluminum circuit layer formed on an aluminum nitride substrate have recently been developed. However, aluminum is inferior in electrical properties to copper, and thus the ceramic circuit boards having an aluminum circuit layer have not come into wide use.

CITATION LIST

Patent Literature

Patent Literature 1: Japanese Unexamined Patent Publication No. H11-251698
Patent Literature 2: Japanese Unexamined Patent Publication No. 2013-18190

SUMMARY OF INVENTION

Technical Problem

It has been proposed to form a metal circuit using a clad foil composed of three or more kinds of different metals in order to achieve both the thermal shock resistance of ceramic circuit board and the electrical properties of metal circuit (Patent Literature 1). Here, as the clad foil used in the metal circuit, one is used which is obtained by providing aluminum and the like having a low tensile strength and a low proof stress as a first metal layer which diminishes the thermal stress due to the difference in thermal expansion between the metal circuit and the ceramic by bonding with ceramic and providing a third metal such as copper exhibiting favorable electrical properties and a second metal, such as nickel, which is interposed between the first metal and the third metal and prevents the reaction and diffusion of these on the first metal layer.

It is expected that a ceramic circuit board exhibiting both thermal shock resistance and electrical properties of metal circuit can be realized by use of the clad foil described above. However, there is a problem that the etching step for circuit formation is significantly complicated since the rates of dissolution of the respective metals constituting the clad foil in the etchant are different from one another.

As a method for forming an aluminum layer and a copper circuit layer on a ceramic substrate, it has been proposed to bond the ceramic substrate with an aluminum plate by brazing and to form a copper circuit layer on the aluminum plate by a cold spray method (Patent Literature 2). It is expected that a highly reliable ceramic circuit board is obtained by this method, but there is also a problem that the step of etching the aluminum layer for circuit formation is complicated.

Accordingly, a main object of the present invention is to provide a method for producing a ceramic circuit board including a metal circuit which has a first metal layer containing aluminum and a second metal layer containing copper and exhibits favorable electrical properties on a ceramic substrate by a simple step.

Solution to Problem

An aspect of the present invention provides a method for producing a ceramic circuit board which includes a ceramic substrate and a metal circuit formed on the ceramic substrate and in which the metal circuit has a first metal layer containing at least either of aluminum or an aluminum alloy and a second metal layer containing at least either of copper or a copper alloy. The method can include:

a step of forming the first metal layer in contact with the ceramic substrate by spraying a first metal powder containing at least either of aluminum particles or aluminum alloy particles together with an inert gas onto a surface of a ceramic substrate from a nozzle, in which the first metal powder is heated to from 10° C. to 270° C. and then ejected from the nozzle and a gauge pressure of the inert gas at an inlet of the nozzle is from 1.5 to 5.0 MPa;

a step of subjecting the first metal layer formed on the ceramic substrate to a heat treatment in an inert gas atmosphere;

a step of forming the second metal layer in contact with the first metal layer by spraying a second metal powder containing at least either of copper particles or copper alloy particles together with an inert gas onto a surface of the first metal layer from a nozzle, in which the second metal powder is heated to from 10° C. to 650° C. and then ejected from the nozzle, a gauge pressure of the inert gas at an inlet of the nozzle is from 1.5 to 5.0 MPa, and the second metal layer is formed so that an end face of the first metal layer and an end face of the second metal layer are flush with each other or an end face of the first metal layer protrudes to an outer side than an end face of the second metal layer; and a step of subjecting the second metal layer formed on the first metal layer to a heat treatment in an inert gas atmosphere.

Advantageous Effects of Invention

According to the present invention, it is possible to produce a ceramic circuit board including a metal circuit which has a first metal layer containing aluminum and/or an aluminum alloy as a main component and a second metal layer containing copper and/or a copper alloy as a main component and exhibits favorable electrical properties by a simple step. In addition, it is possible to form a metal circuit having a wiring pattern on a ceramic substrate without requiring etching by using a mask when the metal circuit layer is formed.

DESCRIPTION OF EMBODIMENTS

Hereinafter, several embodiments of the present invention will be described in detail. However, the present invention is not limited to the following embodiments.

Figure 1:
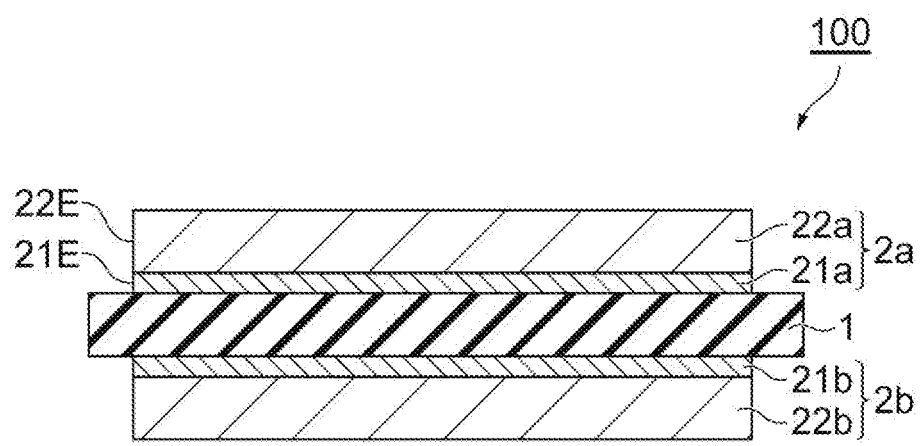
FIG. 1 is a cross-sectional view illustrating an embodiment of a ceramic circuit board.

FIG. 1 is a cross-sectional view illustrating an embodiment of a ceramic circuit board. A ceramic circuit board 100 illustrated in FIG. 1 includes a ceramic substrate 1 and metal circuits 2a and 2b provided on both sides of the ceramic substrate 1. The metal circuit 2a includes a first metal layer 21a in contact with the ceramic substrate 1 and a second metal layer 22a provided on the surface on the opposite side to the ceramic substrate 1 of the first metal layer 21a. The metal circuit 2b includes a first metal layer 21b in contact with the ceramic substrate 1 and a second metal layer 22b provided on the surface on the opposite side to the ceramic substrate 1 of the first metal layer 21b. The first metal layers 21a and 21b and the second metal layers 22a and 22b are each a layer formed by spraying a heated metal powder and often have a circuit pattern to be connected to a semiconductor device and the like.

The first metal layers 21a and 21b contain at least either of aluminum or an aluminum alloy as a main component. The second metal layers 22a and 22b contain at least either of copper or a copper alloy as a main component. Here, the "main component" means a component contained at a proportion of 90% by mass or more based on the total mass of each metal layer. In a case in which the first metal layer contains both aluminum and an aluminum alloy, the total amount thereof may be 90% by mass or more. In the same manner, in a case in which the second metal layer contains both copper and a copper alloy, the entire amount thereof may be 90% by mass or more. The proportion of main component may be 95% by mass or more. The first and second metal layers or metal particles to be described later may contain unavoidable impurities in a trace amount.

The thicknesses of the first metal layers 21a and 21b are not particularly limited but may be, for example, from 30 to 1000 µm. The thicknesses of the second metal layers 22a and 22b are also not particularly limited but may be, for example, from 150 to 3000 µm. The thickness of the second metal layer may be thinner than the thickness of the first metal layer.

In the ceramic circuit board 100 of FIG. 1, an end face 21E of the first metal layers 21a and 21b and an end face 22E of the second metal layers 22a and 22b are flush with each other. However, the end face 21E of the first metal layers 21a and 21b may protrude to an outer side than the end face 22E of the second metal layers 22a and 22b, namely, to an end portion side of the ceramic substrate 1 as in a ceramic circuit board 101 illustrated in FIG. 2. By providing the second metal layers 22a and 22b so that the end portions of the first metal layers 21a and 21b protrude in this manner, the ceramic circuit board can exhibit superior thermal shock resistance. When the thermal shock resistance is insufficient, there is a tendency that the first metal layer cannot sufficiently buffer the thermal stress generated in the second metal layer at the time of thermal shock and cracking of the ceramic substrate easily occur. The width of the part at which the end face 21E of the first metal layer 21a and 21b protrudes more than the end face 22E of the second metal layer 22a and 22b may be, for example, from 1 to 1000 µm.

Figure 2:
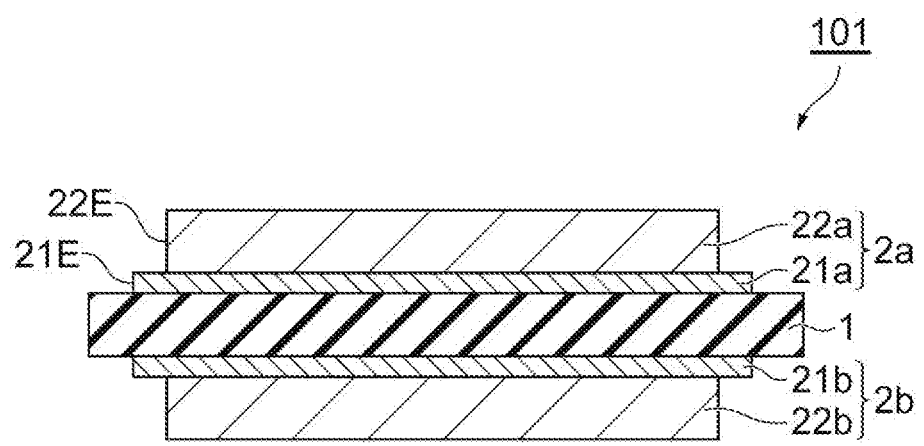
FIG. 2 is a cross-sectional view illustrating an embodiment of a ceramic circuit board.

An embodiment of a method for producing a ceramic circuit board illustrated in FIG. 1 or FIG. 2 is comprised of a step of respectively forming the first metal layers 21a and 21b in contact with the ceramic substrate 1 by spraying a first metal powder containing at least either of aluminum particles or aluminum alloy particles together with an inert gas onto the surface of the ceramic substrate 1 from a nozzle, a step of subjecting the first metal layers 21a and 21b formed on the ceramic substrate 1 to a heat treatment in an inert gas atmosphere, a step of forming the second metal layers 22a and 22b in contact with the first metal layers 21a and 21b by spraying a second metal powder containing at least either of copper particles or copper alloy particles together with an inert gas onto the surface of the first metal layers 21a and 21b from a nozzle, and a step of subjecting the second metal layer 22a and 22b formed on the first metal layers 21a and 21b to a heat treatment in an inert gas atmosphere.

Figure 3:
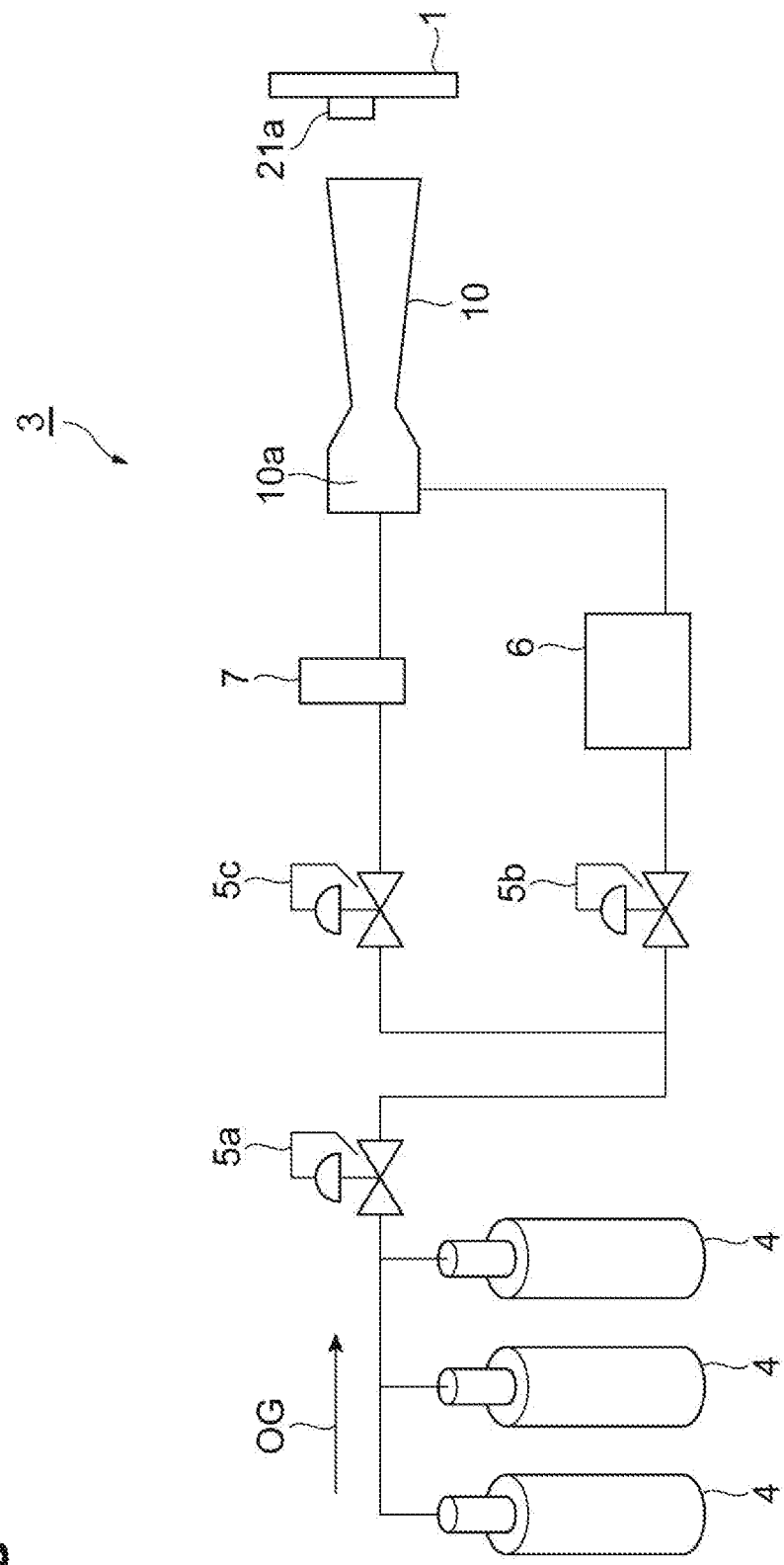
FIG. 3 is a schematic view illustrating an embodiment of a step of forming a metal layer on a ceramic substrate.

FIG. 3 is a schematic view illustrating an embodiment of a step of forming a metal layer on a ceramic substrate. In the method illustrated in FIG. 3, the first metal layer 21a is deposited on the ceramic substrate 1 by spraying a metal powder onto the surface of the ceramic substrate 1 using a powder spray apparatus 3. After deposition of the first metal layer 21a, the first metal layer 21b may be deposited on the back side.

The powder spray apparatus 3 illustrated in FIG. 3 mainly includes high pressure gas cylinders 4, a heater 6, a powder supply apparatus 7, a nozzle 10 of a convergent-divergent spray gun, and pipes connecting these. A first pressure regulator 5a is provided on the downstream side of the plurality of high pressure gas cylinders 4, and the pipe branches into two ways on the downstream side of the first pressure regulator 5a. A second pressure regulator 5b and the heater 6 and a third pressure regulator 5c and the powder supply apparatus 7 are respectively connected to each of the pipes branched into two ways. The pipes from the heater 6 and the powder supply apparatus 7 are connected to the nozzle 10.

In the powder spray apparatus 3, the high pressure gas cylinders 4 are filled with an inert gas to be used as a working gas at a pressure of, for example, 1 MPa or more. The inert gas can be, for example, a single gas of helium or nitrogen or a mixed gas thereof. The working gas OG supplied from the high pressure gas cylinders 4 is subjected to the adjustment of the pressure thereof by the second pressure regulator 5b on one way, then heated by the heater 6, and then supplied to the nozzle 10 of the spray gun. The working gas OG is also subjected to the adjustment of the pressure thereof by the third pressure regulator 5c on the other way and then supplied to the powder supply apparatus 7. The metal powder for deposition is supplied from the powder supply apparatus 7 to the nozzle 10 of the spray gun together with the working gas OG.

The gauge pressure of the working gas OG (inert gas) is adjusted to be from 1.5 to 5.0 MPa at an inlet 10a of the nozzle 10. The gauge pressure of the working gas OG (inert gas) in this range contributes to the efficient formation of the first metal layer. From the same viewpoint, the gauge pressure of the working gas OG (inert gas) at the inlet 10a of the nozzle 10 may be from 2.0 to 4.0 MPa. The gauge pressure of the working gas (inert gas) at the inlet of the nozzle can be measured at the connection part between the nozzle and the pipe.

The heating temperature by the heater 6 is typically set to be lower than the melting point or softening point of the metal powder to be deposited. The heater 6 can be arbitrarily selected from usual heating apparatuses.

The working gas supplied to the nozzle 10 of the spray gun is compressed by passing through the convergent part and is accelerated by expanding at a time at the divergent part on the downstream side thereof. The metal powder is accelerated to a predetermined velocity as well as heated to a predetermined temperature and then ejected through the outlet of the nozzle 10. The metal powder ejected from the nozzle 10 is sprayed onto the surface of the ceramic substrate 1. By this, the metal powder is deposited on the ceramic substrate 1 while colliding with the surface thereof in a solid state, and the first metal layer 21a is thus formed.

The first metal powder may be aluminum particles or aluminum alloy particles containing other metal elements such as aluminum-magnesium alloy particles and aluminum-lithium alloy particles. When aluminum alloy particles containing metal elements such as magnesium and lithium exhibiting higher affinity for oxygen than aluminum is used, there is a tendency that the metal element such as magnesium or lithium reacts with aluminum and the oxide layer on the surface of the ceramic substrate and these firmly bond with each other at the time of heat treatment after deposition. From the viewpoint of the proper hardness of metal layer and the heat cycle resistance, the content of the metal elements such as magnesium and lithium in the first metal powder may be 6.0% by mass or less with respect to the mass of the first metal powder.

In the deposition of the first metal layer, the first metal powder is heated to from 10° C. to 270° C. The heating temperature of the first metal powder in this range contributes to the efficient formation of the first metal layer. From the same viewpoint, the temperature to which the first metal powder is heated may be 260° C. or less and may be 20° C. or more. In the present specification, the temperature to which the metal powder is heated means the maximum temperature of the metal powder reached. The temperature of the inert gas at the inlet of the nozzle 10 can also be regarded as the temperature to which the metal powder is heated. Here, the term "heating" in the present specification is used in the meaning including adjusting the temperature to a predetermined temperature equal to or less than room temperature.

The first metal layer having a pattern (circuit pattern) may be formed on the ceramic substrate by disposing a mask material covering a part of the surface of the ceramic substrate 1 on the ceramic substrate 1. According to this method, it is possible to easily form a metal circuit having a desired pattern without requiring an additional step such as etching after deposition. In this respect as well, the method according to the present embodiment is advantageous over the molten metal method and the brazing method which require etching for pattern formation.

The first metal powder may be accelerated to from 250 to 1050 m/s in the nozzle 10. In the present specification, the velocity to which the metal powder is accelerated means the maximum velocity which the accelerated metal powder reaches. When the velocity which the accelerated metal powder reaches is less than 250 m/s, it is difficult for the metal powder to be sufficiently plastically deformed at the moment at which the metal powder collides with the ceramic substrate and the like, and there is thus a tendency that it is difficult to perform deposition or the adhesion of the deposited metal layer deteriorates. When the velocity which the accelerated metal powder reaches exceeds 1050 m/s, the metal powder is pulverized and scattered when the metal powder collides with the ceramic substrate and the like and there is thus a tendency that it is difficult to perform deposition.

The first metal layer formed on the ceramic substrate is subjected to a heat treatment in an inert gas atmosphere. The heating temperature of the first metal layer for this heat treatment may be from 400° C. to 600° C. By heating the first metal layer at a temperature of 400° C. or more, the reaction between the aluminum and the oxide layer on the surface of the ceramic substrate further proceeds and bonding is firmly performed. In addition, it is possible to diminish the influence of the softening of the first metal layer by heating the first metal layer at a temperature of 600° C. or less.

The second metal layers 22a and 22b containing copper and/or copper alloy as a main component are formed by spraying the second metal powder onto the surfaces of the first metal layers 21a and 21b using the powder spray apparatus illustrated in FIG. 3 after the heat treatment of the first metal layer. Examples of the copper alloy constituting the second metal layer include a copper-phosphorus alloy and a copper-molybdenum alloy. In other words, the second metal powder can include copper particles and/or copper alloy particles such as copper-phosphorus alloy particles or copper-molybdenum alloy particles. The content of the metal elements other than copper in the second metal powder may be 6.0% by mass or less with respect to the mass of the second metal powder.

In the deposition of the second metal layer, the second metal powder is heated to from 10° C. to 650° C. The heating temperature of the second metal powder in this range contributes to the efficient formation of the second metal layer. When the second metal powder is heated at a temperature higher than 650° C., there is the possibility that the softened copper particles or copper alloy particles adhere to the inner wall of the nozzle, as a result, the nozzle is clogged, and it is difficult to form the second metal layer. When the temperature of the second metal powder is less than 10° C., there is a tendency that plastic deformation of the copper particles or copper alloy particles is significantly suppressed and it is difficult to form the second metal layer. From the same viewpoint, the temperature to which the second metal powder is heated may be 640° C. or less and may be 20° C. or more.

In the deposition of the second metal layer as well, the gauge pressure of the working gas OG (inert gas) is adjusted to be from 1.5 to 5.0 MPa at the inlet 10a of the nozzle 10. The gauge pressure of the working gas OG (inert gas) in this range contributes to the efficient formation of the second metal layer. When the gauge pressure of the working gas (inert gas) at the inlet of the nozzle is less than 1.5 MPa, there is a tendency that the second metal powder hardly comes into close contact with the first metal layer. When the gauge pressure of the working gas (inert gas) at the inlet of the nozzle exceeds 5.0 MPa, there is a tendency that the second metal powder sprayed onto the first metal layer together with the inert gas is crushed and the efficiency of the formation of the second metal layer decreases. From the same viewpoint, the gauge pressure of the working gas OG (inert gas) at the inlet 10a of the nozzle 10 may be from 2.0 to 4.0 MPa.

The conditions for deposition of the second metal powder other than these can be adjusted in the same manner as those for the first metal layer. The second metal layer having a pattern may be formed by disposing a mask material on the ceramic substrate 1 at the time of formation of the second metal layer.

The second metal layer formed on the first metal layer is subjected to a heat treatment in an inert gas atmosphere. The heating temperature of the first metal layer for this heat treatment may be from 250° C. to 350° C. By heating the second metal layer at a temperature of 250° C. or more, strain in the second metal layer due to work hardening can be diminished. By heating the second metal layer at a relatively low temperature of 350° C. or less, it is possible to suppress the generation of an intermetallic compound by the reaction of the first metal layer with the second metal layer and the diffusion of metal components. This can also contribute to the improvement in the reliability of the ceramic circuit board.

The first metal powder and/or the second metal powder may be spherical particles in order to suppress the formation of pores in the first metal layer and the second metal layer. In addition, the variation in particle diameter of the first metal powder and/or the second metal powder may be small. The (average) particle diameter of the metal powder may be from 10 to 70 µm or from 20 to 60 µm. When the particle diameter of the metal powder is less than 10 µm, the metal powder tends to easily clog at the convergent part of the nozzle. When the particle diameter of the metal powder exceeds 70 µm, it tends to be difficult to sufficiently increase the velocity of the metal powder. Here, the "particle diameter" means the maximum width of each particle. The particle diameter of a sufficient number of particles of metal powder can be measured, and the average particle diameter can be determined from the result.

The ceramic substrate can be selected from those exhibiting proper insulating properties. The ceramic substrate may exhibit high thermal conductivity. Examples of the ceramic substrate include an aluminum nitride (AlN) substrate, a silicon nitride ($Si_3N_4$) substrate, and aluminum oxide ($Al_2O_3$). The aluminum nitride substrate may exhibit a three-point bending strength of 400 MPa or more and/or a thermal conductivity of 150 W/mK or more. The silicon nitride substrate may exhibit a three-point bending strength of 600 MPa or more and/or a thermal conductivity of 50 W/mK or more. The size of the ceramic substrate 1 is arbitrarily set according to the application. The thickness of the ceramic substrate 1 is not particularly limited but may be, for example, from 0.2 to 1.0 mm. These ceramic substrates can be respectively procured as commercial products.

EXAMPLES

Hereinafter, the present invention will be more specifically described with reference to Examples. However, the present invention is not limited to these Examples.

In all Examples and all Comparative Examples, an aluminum nitride (AlN) substrate (size: 60 mm×50 mm×0.635 mm t, three-point bending strength: 500 MPa, thermal conductivity: 150 W/mK, and purity: 95% or more) or a silicon nitride ($Si_3N_4$) substrate (size: 60 mm×50 mm×0.635 mm t, three-point bending strength: 700 MPa, thermal conductivity: 70 W/mK, and purity: 92% or more) was used as a ceramic substrate.

Example 1

A part of the aluminum nitride substrate was masked with an iron mask material. An aluminum layer (first metal layer) having a length of 56 mm, a width of 46 mm, and a thickness of 0.2 mm was formed thereon in a range of 2 mm inside from the substrate end face in each of the front and back of the aluminum nitride substrate using aluminum powder (gas atomized powder manufactured by Kojundo Chemical Laboratory Co., Ltd., median diameter: 24 µm) and a powder spray apparatus having the same configuration as that illustrated in FIG. 3. The deposition of aluminum layer was performed using nitrogen as A working gas under the conditions in which the temperature of aluminum powder was set to 20° C. and the pressure of working gas at the nozzle inlet of the spray gun was set to 1.5 MPa.

The formed aluminum layer was maintained at 500° C. for 3 hours in a nitrogen atmosphere for a heat treatment.

Next, a part of the aluminum layer was masked with an iron mask material, and a copper layer (second metal layer having a length of 55.9, a width of 45.9, and a thickness of 0.4 mm) was formed in a range of 50 µm inside from the end face of the aluminum layer using copper powder (water atomized powder manufactured by Fukuda Metal Foil & Powder Co., Ltd., median diameter: 17 µm) and a powder spray apparatus having the same configuration as that illustrated in FIG. 3. The deposition of the copper layer was performed using nitrogen as a working gas under the conditions in which the temperature of copper powder was set to 20° C. and the pressure of working gas at the nozzle inlet was set to 1.5 MPa. The end face of the aluminum layer protruded to the outer side than the end face of the copper layer by a width of 50 µm.

The formed copper layer was maintained at 300° C. for 1 hour in a nitrogen atmosphere for a heat treatment.

According to the procedure described above, a test piece in which a circuit layer composed of an aluminum layer and a copper layer was formed on both sides of an aluminum nitride substrate was obtained.

Example 2

A part of a silicon nitride substrate was masked with an iron mask material. An aluminum layer (first metal layer) having a length of 56 mm, a width of 46 mm, and a thickness of 0.2 mm was formed thereon in a range of 2 mm inside from the substrate end face in each of the front and back of the aluminum nitride substrate using aluminum powder (gas atomized powder manufactured by Kojundo Chemical Laboratory Co., Ltd., median diameter: 24 µm) and a powder spray apparatus having the same configuration as that illustrated in FIG. 3. The deposition of aluminum layer was performed using nitrogen as a working gas under the conditions in which the temperature of aluminum powder was set to 260° C. and the pressure of working gas at the nozzle inlet was set to 1.5 MPa.

The formed aluminum layer was maintained at 500° C. for 3 hours in a nitrogen atmosphere for a heat treatment.

Next, a part of the aluminum layer was masked with an iron mask material, and a copper layer (second metal layer having a length of 55.9, a width of 45.9, and a thickness of 0.4 mm) was formed in a range of 50 µm inside from the end face of the aluminum layer using copper powder (water atomized powder manufactured by Fukuda Metal Foil & Powder Co., Ltd., median diameter: 17 μm) and a powder spray apparatus having the same configuration as that illustrated in FIG. 3. The deposition of the copper layer was performed using nitrogen as a working gas under the conditions in which the temperature of copper powder was set to 640° C. and the pressure of working gas at the nozzle inlet was set to 1.5 MPa. The end face of the aluminum layer protruded to the outer side than the end face of the copper layer by a width of 50 μm.

The formed copper layer was maintained at 300° C. for 1 hour in a nitrogen atmosphere for a heat treatment.

According to the procedure described above, a test piece in which a circuit layer composed of an aluminum layer and a copper layer was formed on both sides of a silicon nitride substrate was obtained.

Example 3

A test piece was fabricated in the same manner as in Example 2. However, the conditions for the deposition of aluminum layer were changed so that the temperature of the aluminum powder was set to 20° C. and the pressure of working gas at the nozzle inlet was set to 5.0 MPa and the conditions for the deposition of copper layer were changed so that the temperature of the copper powder was set to 20° C. and the pressure of working gas at the nozzle inlet was set to 5.0 MPa.

Example 4

A test piece was fabricated in the same manner as in Example 1. However, the conditions for the deposition of aluminum layer were changed so that the temperature of the aluminum powder was set to 260° C. and the pressure of working gas at the nozzle inlet was set to 5.0 MPa and the conditions for the deposition of copper layer were changed so that the temperature of the copper powder was set to 640° C. and the pressure of working gas at the nozzle inlet was set to 5.0 MPa.

Example 5

A test piece was fabricated in the same manner as in Example 1. However, the conditions for the deposition of aluminum layer were changed so that the temperature of the aluminum powder was set to 200° C. and the pressure of working gas at the nozzle inlet was set to 3.0 MPa and the conditions for the deposition of copper layer were changed so that the temperature of the copper powder was set to 350° C. and the pressure of working gas at the nozzle inlet was set to 3.0 MPa.

Example 6

A test piece was fabricated in the same manner as in Example 2. However, the conditions for the deposition of aluminum layer were changed so that the temperature of the aluminum powder was set to 200° C. and the pressure of working gas at the nozzle inlet was set to 3.0 MPa and the conditions for the deposition of copper layer were changed so that the temperature of the copper powder was set to 350° C. and the pressure of working gas at the nozzle inlet was set to 3.0 MPa.

Example 7

A test piece was fabricated in the same manner as in Example 5. However, the copper layer was formed so that the end face of the copper layer and the end face of the aluminum layer were flush with each other.

Example 8

A test piece was fabricated in the same manner as in Example 6. However, the copper layer was formed so that the end face of the copper layer and the end face of the aluminum layer were flush with each other.

Comparative Example 1

A test piece was fabricated in the same manner as in Example 5 except that the copper layer was not subjected to a heat treatment after being formed.

Comparative Example 2

A test piece was fabricated in the same manner as in Example 6 except that the copper layer was not subjected to a heat treatment after being formed.

Comparative Example 3

The deposition of a copper layer was attempted under the same conditions as those in Example 5 except that the pressure of working gas at the nozzle inlet was changed to a condition of 1.0 MPa, but the copper powder was not attached to the aluminum layer and it was not able to form a copper layer.

Comparative Example 4

The deposition of a copper layer was attempted under the same conditions as those in Example 6 except that the pressure of working gas at the nozzle inlet was changed to a condition of 5.5 MPa, but the copper powder was not attached to the aluminum layer and it was not able to form a copper layer.

Comparative Example 5

The deposition of a copper layer was attempted under the same conditions as those in Example 5 except that the temperature of copper powder was changed to 0° C., but the copper powder was not attached to the aluminum layer and it was not able to form a copper layer.

Comparative Example 6

The deposition of a copper layer was attempted under the same conditions as those in Example 6 except that the temperature of copper powder was changed to 660° C., but the copper powder was not attached to the aluminum layer and it was not able to form a copper layer.

Comparative Example 7

An aluminum layer was formed under the same conditions as those in Example 5. Thereafter, the deposition of a copper layer was attempted under the same conditions as those in Example 5 without heating the aluminum layer, but the aluminum layer was peeled off from the silicon nitride substrate during the formation of copper layer and it was not able to fabricate a test piece.

Comparative Example 8

An aluminum layer was formed under the same conditions as those in Example 6. Thereafter, the deposition of a copper layer was attempted under the same conditions as those in Example 6 without heating the aluminum layer, but the aluminum layer was peeled off from the silicon nitride substrate during the formation of copper layer and it was not able to fabricate a test piece.

Comparative Example 9

The deposition of an aluminum layer was attempted under the same conditions as those in Example 5 except that the pressure of working gas at the nozzle inlet was changed to a condition of 1.0 MPa, but the aluminum powder was not attached to the aluminum nitride substrate and it was not able to form an aluminum layer.

Comparative Example 10

The deposition of an aluminum layer was attempted under the same conditions as those in Example 6 except that the pressure of working gas at the nozzle inlet was changed to a condition of 5.5 MPa, but the aluminum powder was not attached to the silicon nitride substrate and it was not able to form an aluminum layer.

Comparative Example 11

The deposition of an aluminum layer was attempted under the same conditions as those in Example 5 except that the temperature of aluminum powder was changed to 0° C., but the aluminum powder was not attached to the aluminum nitride substrate and it was not able to form an aluminum layer.

Comparative Example 12

The deposition of an aluminum layer was attempted under the same conditions as those in Example 6 except that the temperature of aluminum powder was changed to 280° C., but the aluminum powder clogged at the convergent part of the nozzle and it was not able to form an aluminum layer.

The conditions for the fabrication of test pieces and the results on the success or failure of deposition are presented in Table 1.

TABLE 1

| | | Ceramic substrate | First metal layer (aluminum) | | | Second metal layer (copper) | | | Protrusion of first metal layer | Success or failure of deposition |
|---|---|---|---|---|---|---|---|---|---|---|
| | | | Gas temp. (nozzle inlet) | Gas pressure (nozzle inlet) | Heat treatment | Gas temp. (nozzle inlet) | Gas pressure (nozzle inlet) | Heat treatment | | |
| Ex. | 1 | AlN | 20° C. | 1.5 MPa | With | 20° C. | 1.5 MPa | With | Presence | Success |
| | 2 | Si$_3$N$_4$ | 260° C. | 1.5 MPa | With | 640° C. | 1.5 MPa | With | Presence | Success |
| | 3 | Si$_3$N$_4$ | 20° C. | 5.0 MPa | With | 20° C. | 5.0 MPa | With | Presence | Success |
| | 4 | AlN | 260° C. | 5.0 MPa | With | 640° C. | 5.0 MPa | With | Presence | Success |
| | 5 | AlN | 200° C. | 3.0 MPa | With | 350° C. | 3.0 MPa | With | Presence | Success |
| | 6 | Si$_3$N$_4$ | 200° C. | 3.0 MPa | With | 350° C. | 3.0 MPa | With | Presence | Success |
| | 7 | AlN | 200° C. | 3.0 MPa | With | 350° C. | 3.0 MPa | With | Absence | Success |
| | 8 | Si$_3$N$_4$ | 200° C. | 3.0 MPa | With | 350° C. | 3.0 MPa | With | Absence | Success |
| Comp. Ex. | 1 | AlN | 200° C. | 3.0 MPa | With | 350° C. | 3.0 MPa | Without | Presence | Success |
| | 2 | Si$_3$N$_4$ | 200° C. | 3.0 MPa | With | 350° C. | 3.0 MPa | Without | Presence | Success |
| | 3 | AlN | 200° C. | 3.0 MPa | With | 350° C. | 1.0 MPa | — | — | Failure |
| | 4 | Si$_3$N$_4$ | 200° C. | 3.0 MPa | With | 350° C. | 5.5 MPa | — | — | Failure |
| | 5 | AlN | 200° C. | 3.0 MPa | With | 0° C. | 3.0 MPa | — | — | Failure |
| | 6 | Si$_3$N$_4$ | 200° C. | 3.0 MPa | With | 660° C. | 3.0 MPa | — | — | Failure |
| | 7 | AlN | 200° C. | 3.0 MPa | Without | 350° C. | 3.0 MPa | — | — | Failure |
| | 8 | Si$_3$N$_4$ | 200° C. | 3.0 MPa | Without | 350° C. | 3.0 MPa | — | — | Failure |
| | 9 | AlN | 200° C. | 1.0 MPa | — | — | — | — | — | Failure |
| | 10 | Si$_3$N$_4$ | 200° C. | 5.5 MPa | — | — | — | — | — | Failure |
| | 11 | AlN | 0° C. | 3.0 MPa | — | — | — | — | — | Failure |
| | 12 | Si$_3$N$_4$ | 280° C. | 3.0 MPa | — | — | — | — | — | Failure |

Measurement of Conductivity

The conductivity of the metal circuit layer in the test pieces of Examples 1 to 8 and Comparative Examples 1 and 2 was measured by the eddy current method. The test pieces of Examples 1 to 8 exhibited high conductivity to have a conductivity of 90% by IACS or more. The conductivity of the test pieces of Comparative Examples 1 and 2 was 60% by IACS to be low.

Heat Cycle Test

The test pieces of Examples 1 to 8 which exhibited favorable conductivity were subjected to a heat cycle test of 1000 cycles when the test piece was "left to stand in an environment of 180° C. for 30 minutes and then left to stand in an environment of −45° C. for 30 minutes" was taken as one cycle. After the heat cycle test, abnormality such as peeling off of the aluminum layer or the copper layer was not confirmed in the test pieces of Examples 1 to 8.

INDUSTRIAL APPLICABILITY

According to the present invention, it is possible to produce a highly reliable ceramic circuit board.

REFERENCE SIGNS LIST

1: ceramic substrate, 2a, 2b: metal circuit, 3: powder spray apparatus, 4: high pressure gas cylinder, 5a: first pressure regulator, 5b: second pressure regulator, 5c: third pressure regulator, 6: heater, 7: powder supply apparatus, 10: nozzle of spray gun, 10a: inlet of nozzle, 21a, 21b: first metal layer, 22a, 22b: second metal layer.

The invention claimed is:

1. A method for producing a ceramic circuit board including a ceramic substrate and a metal circuit formed on the ceramic substrate, the metal circuit having a first metal layer containing at least either of aluminum or an aluminum alloy and a second metal layer containing at least either of copper or a copper alloy, the method comprising, in order:

a step of forming the first metal layer in contact with the ceramic substrate by spraying a first metal powder containing at least either of aluminum particles or aluminum alloy particles together with an inert gas onto a surface of the ceramic substrate from a nozzle, the first metal powder being heated to from 10° C. to 270° C. and then ejected from the nozzle, and a gauge pressure of the inert gas at an inlet of the nozzle being from 1.5 to 5.0 MPa;

a step of subjecting the first metal layer formed on the ceramic substrate to a heat treatment by heating in a range of 400° C. to 600° C. in an inert gas atmosphere;

a step of forming the second metal layer in contact with the first metal layer by spraying a second metal powder containing at least either of copper particles or copper alloy particles together with an inert gas onto a surface of the first metal layer from a nozzle, the second metal powder being heated to from 10° C. to 650° C. and then ejected from the nozzle, a gauge pressure of the inert gas at an inlet of the nozzle being from 1.5 to 5.0 MPa, and the second metal layer being formed so that an end face of the first metal layer and an end face of the second metal layer are flush with each other or an end face of the first metal layer protrudes to an outer side than an end face of the second metal layer; and a step of subjecting the second metal layer formed on the first metal layer to a heat treatment by heating in a range of 250° C. to 350° C. in an inert gas atmosphere.

2. The method according to claim 1, wherein average particle diameters of the first metal powder and the second metal powder are from 10 to 70 μm.

3. The method according to claim 1, wherein the first metal layer and the second metal layer which have a pattern are formed by disposing a mask material covering a part of a surface of the ceramic substrate on the ceramic substrate in the step of forming the first metal layer and the step of forming the second metal layer.

* * * * *